(12) United States Patent
Il et al.

(10) Patent No.: US 11,235,926 B2
(45) Date of Patent: Feb. 1, 2022

(54) STORAGE SYSTEM INCLUDING A VERTICAL TRANSFER DEVICE

(71) Applicants: DAIFUKU AMERICA CORPORATION, Reynoldsburg, OH (US); DAIFUKU CO., LTD., Osaka (JP); Tatsuki Il, Chandler, AZ (US); Akira Okamoto, Hillsboro, OR (US); Kazuya Omori, Chandler, AZ (US)

(72) Inventors: Tatsuki Il, Chandler, AZ (US); Akira Okamoto, Hillsboro, OR (US); Kazuya Omori, Chandler, AZ (US)

(73) Assignees: DAIFUKU AMERICA CORPORATION, Reynoldsburg, OH (US); DAIFUKU CO., LTD., Osaka (JP)

( * ) Notice: Subject to any disclaimer, the term of this patent is extended or adjusted under 35 U.S.C. 154(b) by 240 days.

(21) Appl. No.: 16/603,052

(22) PCT Filed: Apr. 2, 2018

(86) PCT No.: PCT/US2018/025688
§ 371 (c)(1),
(2) Date: Oct. 4, 2019

(87) PCT Pub. No.: WO2018/187208
PCT Pub. Date: Oct. 11, 2018

(65) Prior Publication Data
US 2021/0078800 A1    Mar. 18, 2021

Related U.S. Application Data

(60) Provisional application No. 62/482,395, filed on Apr. 6, 2017.

(51) Int. Cl.
*B65D 90/00*    (2006.01)
*B65G 1/04*    (2006.01)
(Continued)

(52) U.S. Cl.
CPC ............ *B65G 1/04* (2013.01); *B65D 90/0033* (2013.01); *B66F 9/18* (2013.01); *H01L 21/67769* (2013.01)

(58) Field of Classification Search
CPC ......... B65G 1/04; B65D 90/0033; B66F 9/18; H01L 21/67769
See application file for complete search history.

(56) References Cited

U.S. PATENT DOCUMENTS 10,159,860 B2    12/2018    Yoshioka
10,274,214 B2    4/2019    Otsuka et al.
(Continued)

FOREIGN PATENT DOCUMENTS

CN    85105025 A    1/1987
CN    1406839 A    4/2003
(Continued)

OTHER PUBLICATIONS

Taiwan Office Action from the Taiwan Intellectual Property Office for related Taiwan Invention Application No. 107112094 dated Mar. 29, 2021, 6 page(s).

(Continued)

*Primary Examiner* — Saul Rodriguez
*Assistant Examiner* — Willie Berry, Jr.
(74) *Attorney, Agent, or Firm* — Dickinson Wright PLLC

(57) ABSTRACT

A load storage system is provided for holding standardized containers including a first stocker for being positioned on a first story and a second stocker for being positioned on a second story. The first and second stockers each include at least one load support for supporting the standardized containers. A floor is positioned between the first and second stockers. The floor defines a portal between and directly connecting the first and second stockers. The portal is positioned in alignment with the load supports in the first (Continued)

and second stockers. A vertical transfer device is positioned in alignment with the load supports in the first and second stockers and is configured to move the standardized containers through the portal between the first and second stockers. A method of operating the load storage system is also provided.

18 Claims, 6 Drawing Sheets

(51) Int. Cl.
*B66F 9/18* (2006.01)
*H01L 21/677* (2006.01)

(56) References Cited

U.S. PATENT DOCUMENTS

| | | |
|---|---|---|
| 2008/0075564 A1 | 3/2008 | Tachibana |
| 2008/0152466 A1 | 6/2008 | Bonora et al. |
| 2009/0081010 A1 | 3/2009 | Jayasuriya |
| 2013/0270063 A1 | 10/2013 | Toshinaga |
| 2014/0112741 A1* | 4/2014 | Yoshioka .............. H01L 21/677 414/222.01 |
| 2015/0004899 A1 | 1/2015 | Otsuka et al. |
| 2016/0214831 A1 | 7/2016 | Yoshioka |
| 2016/0348843 A1 | 12/2016 | Takahara et al. |

FOREIGN PATENT DOCUMENTS

| | | |
|---|---|---|
| CN | 106429138 A | 2/2017 |
| JP | S63196050 A | 8/1988 |
| JP | H06115615 A | 4/1994 |
| JP | 2003072908 A | 3/2003 |
| JP | 2005001886 A | 1/2005 |
| JP | 2009173396 A | 8/2009 |
| JP | 2010514211 A | 4/2010 |
| JP | 2012025549 A | 2/2012 |
| JP | 2014241377 A | 12/2014 |
| JP | 2015009912 A | 1/2015 |
| JP | 2016137967 A | 8/2016 |
| TW | 201634362 A | 10/2016 |
| WO | 2006035473 A1 | 4/2006 |

OTHER PUBLICATIONS

Chinese Office Action from corresponding Chinese Application No. 201880022807.1 dated Sep. 24, 2020, 15 pages, English Translation of the Chinese Office Action is included.
Japanese Office Action from the Japanese Patent Office for related Japanese Patent Application No. 2019-555146.

* cited by examiner

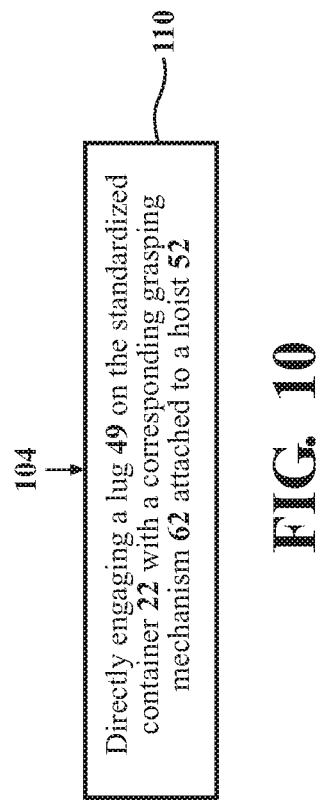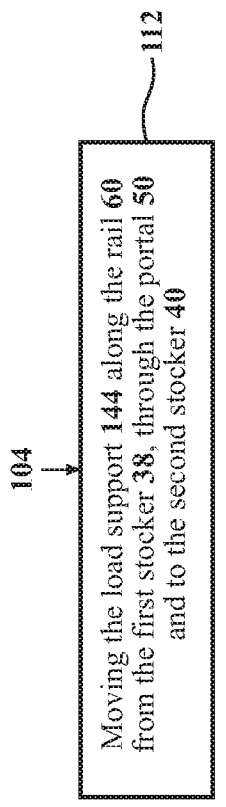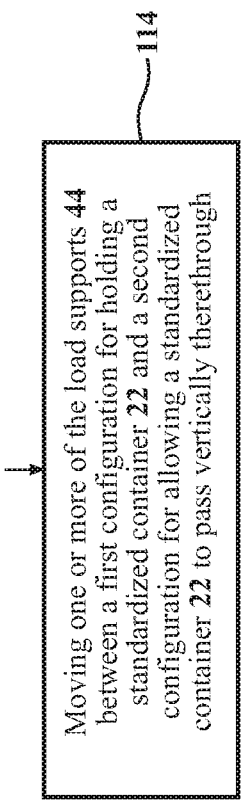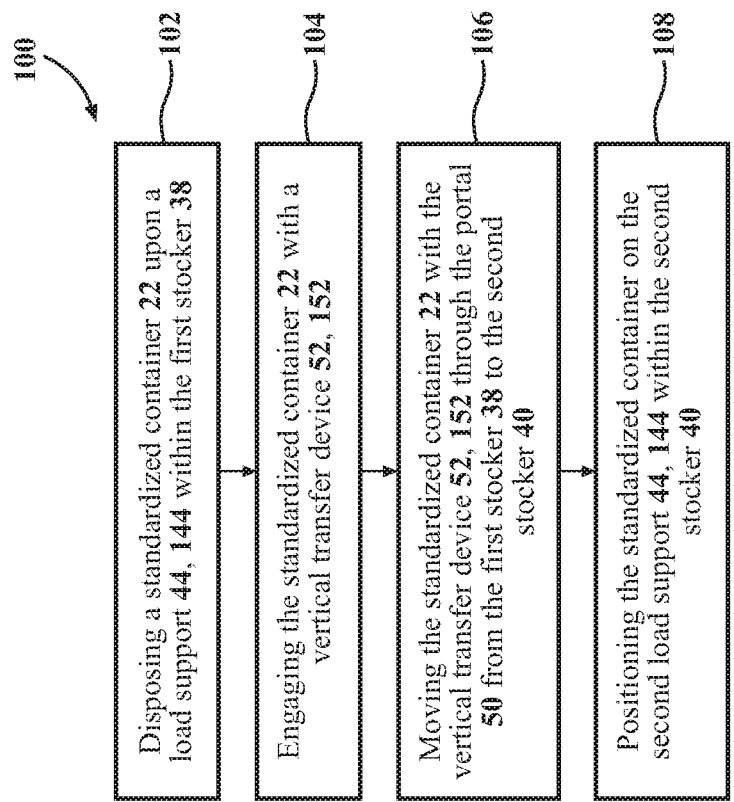

STORAGE SYSTEM INCLUDING A VERTICAL TRANSFER DEVICE

CROSS REFERENCE TO RELATED APPLICATIONS

This U.S. National Stage Patent Application claims the benefit of PCT International Patent Application Serial No. PCT/US2018/025688 filed Apr. 2, 2018 entitled "Storage System Including A Vertical Transfer Device" which claims the benefit of U.S. Provisional Patent Application Ser. No. 62/482,395 filed Apr. 6, 2017 entitled "Vertical Transfer Device," the entire disclosures of the applications being considered part of the disclosure of this application and hereby incorporated by reference.

TECHNICAL FIELD

A storage system. More specifically, storage system including a vertical transfer device for moving standardized containers directly between stockers on different floors of a building.

BACKGROUND OF THE INVENTION

Stockers (STKs) are a type of storage compartment used in a number of industries for holding standardized containers, articles of manufacture or components thereof. Specialized versions of stockers may include special features for specific applications. For instance, stockers used for holding front opening unified pods (FOUPs) in semiconductor fabrication plants may include enclosures for maintaining a controlled atmosphere and specialized interfaces for interacting with an automated material handling system (AMHS). In some applications, stockers are required on multiple different stories of a building. As illustrated in FIGS. 1-4, the traditional method of moving a standardized container 1 between a stocker 2 on a second story 4 to a stocker 2 on a first story 3 of a building requires horizontally moving the standardized container 1 out of a shelf 5 of the stocker 2 on the second story 4 to a separate lifting device 6. Once the standardized container 1 is positioned on the lifting device 6, it is vertically moved to the first story 3 with the lifting device 6. The standardized container 1 is then horizontally moved into a shelf 5 of the stocker 2 on the first story 3 by way of conveyor 7. The system may further include an overhead transfer system 8 for moving the standardized containers 1 to different regions of the stockers 2. Accordingly, this method requires multiple steps and involves multiple pieces of equipment to move the standardized containers 1. The method also requires moving the standardized containers 1 through multiple different spaces, thus increasing the risks of potential contamination.

In view of the foregoing, there remains a need for improvements to systems for moving standardized containers within a load storage system, and particularly between vertical racks on different stories of a building.

SUMMARY OF THE INVENTION

According to an aspect of the disclosure, a load storage system is provided for holding standardized containers. The load storage system includes a first stocker for being positioned on a first story of a building and a second stocker for being positioned on a second story of a building. The first and second stockers each include at least one load support for supporting the standardized containers. A floor is positioned between the first and second stockers. The floor defines a portal between, and directly connecting the first and second stockers for allowing the standardized containers to be moved between the first and second stockers. The portal is positioned in alignment with at least one of the load supports in the first stocker and at least one of the load supports in the second stocker. A vertical transfer device is positioned in alignment with at least one of the load supports in the first stocker and at least one of the load supports in the second stocker and is configured to move the standardized containers through the portal between the first and second stockers.

According to another aspect of the disclosure, a method is provided for moving a standardized container within a load storage system directly between a first stocker on a first story of a building including a first load support, and a second stocker on a second story of a building directly above the first stocker and including a second load support. A floor is positioned between the first and second stockers. A portal is defined by the floor between the first and second stockers in alignment with the first load support in the first stocker and the second load support in the second stocker. The method comprises the steps of disposing a standardized container upon the load support within the first stocker, engaging the standardized container with a vertical transfer device, moving the standardized container with the vertical transfer device through the portal from the first stocker to the second stocker, positioning the standardized container on the second load support within the second stocker, and disengaging the standardized container from the vertical transfer device.

Accordingly, the vertical transfer device of the present invention can transfer standardized containers more quickly than systems of the prior art because it transfers the containers directly between the stockers through the portal with the vertical transfer device, without requiring transfer by other conveying devices. Also, risks associated with potential contamination are minimized because the present invention allows standardized containers to be moved directly between vertical racks on different stories of a building without requiring the standardized containers to be moved through multiple different spaces (such as on conveyors or overhead transfer devices). Furthermore, the present invention allows the standardized containers to be moved with fewer transfers between different conveyance devices than the methods of the prior art, thereby minimizing the risk of damage to the contents of the standardized containers which may result from each transfer.

BRIEF DESCRIPTION OF THE DRAWINGS

Other advantages of the present invention will be readily appreciated, as the same becomes better understood by reference to the following detailed description when considered in connection with the accompanying drawings wherein:

FIG. 9 is a flow chart of a method of moving a standardized container within a load storage system;

FIG. 10 is a flow chart including a sub-step of the method of FIG. 9 according to an aspect of the present disclosure;

FIG. 11 is a flow chart including sub-steps of the method of FIG. 9 according to another aspect of the present disclosure; and FIG. 12 is a flow chart including sub-steps of the method of FIG. 9 according to another aspect of the present disclosure.

DESCRIPTION OF THE ENABLING EMBODIMENTS

Figure 1:
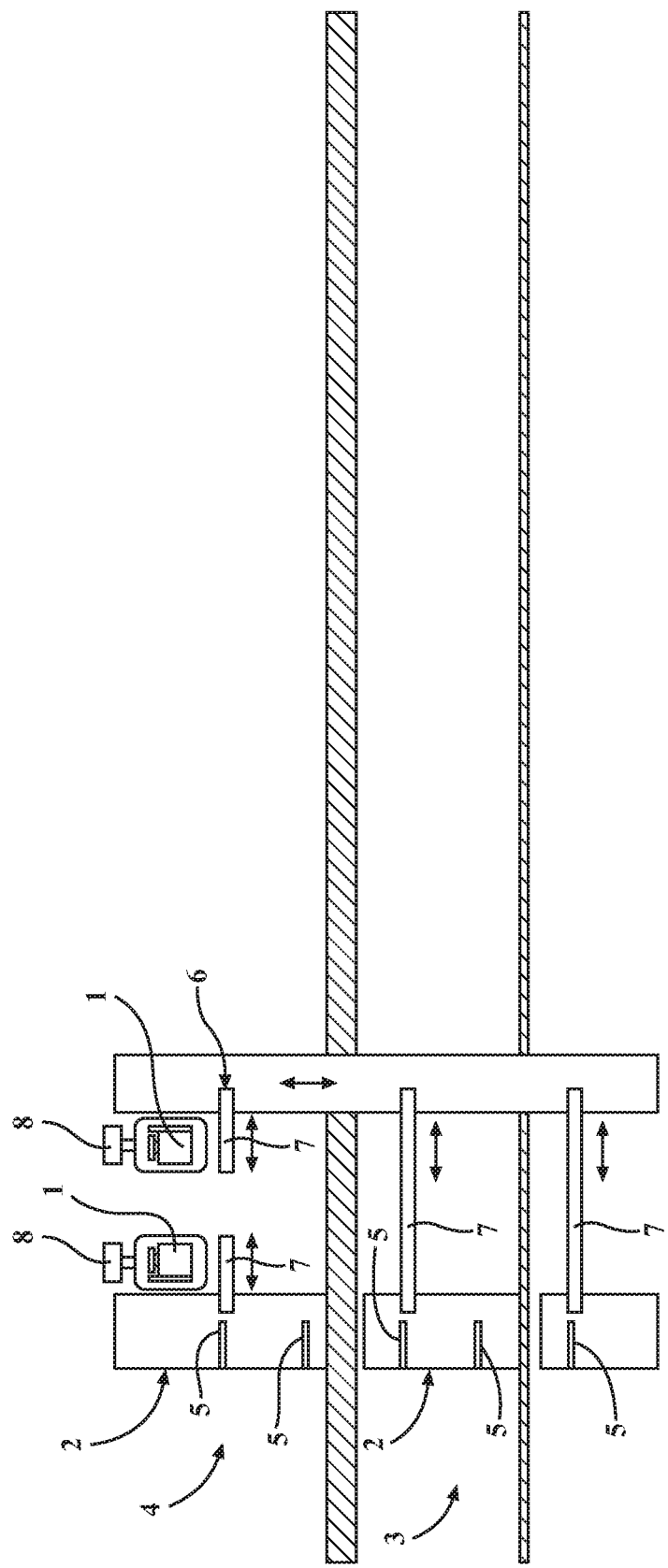
FIG. 1 is cross-sectional side view of a fabrication facility including a load storage system of the prior art.
Figure 3:
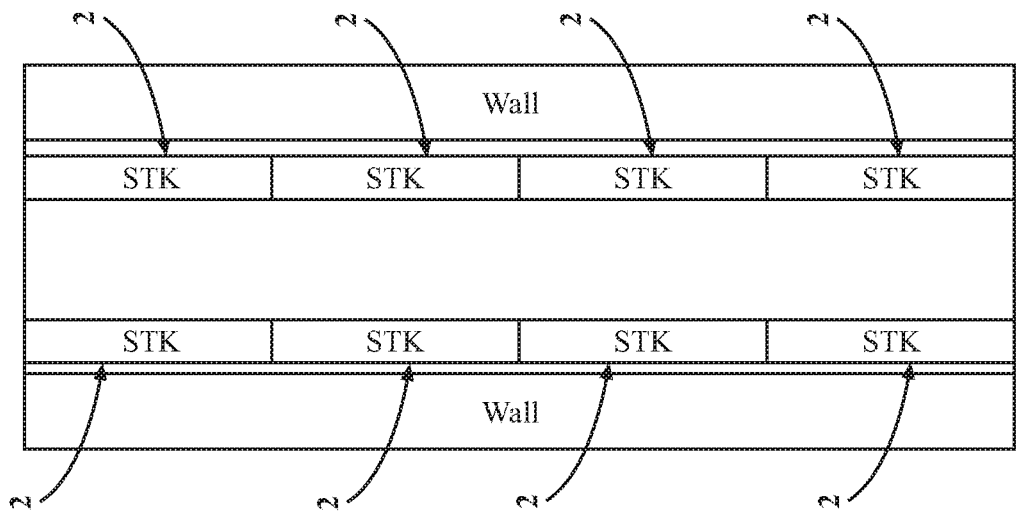
FIG. 3 is a layout top view of the intermediate, subfab/utility story of the fabrication facility of FIG. 1.
Figure 2:
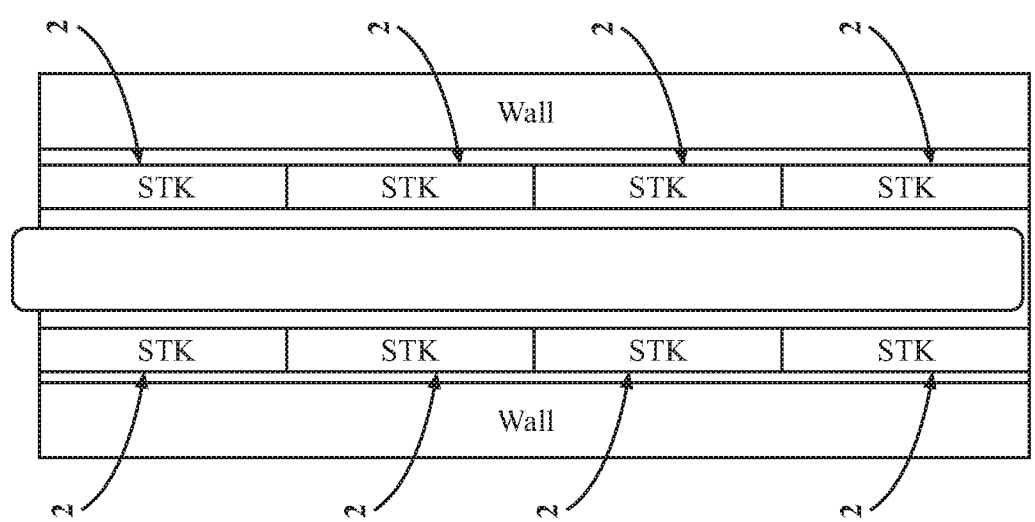
FIG. 2 is a layout top view of the upper, cleanroom story of the fabrication facility of FIG. 1.
Figure 4:
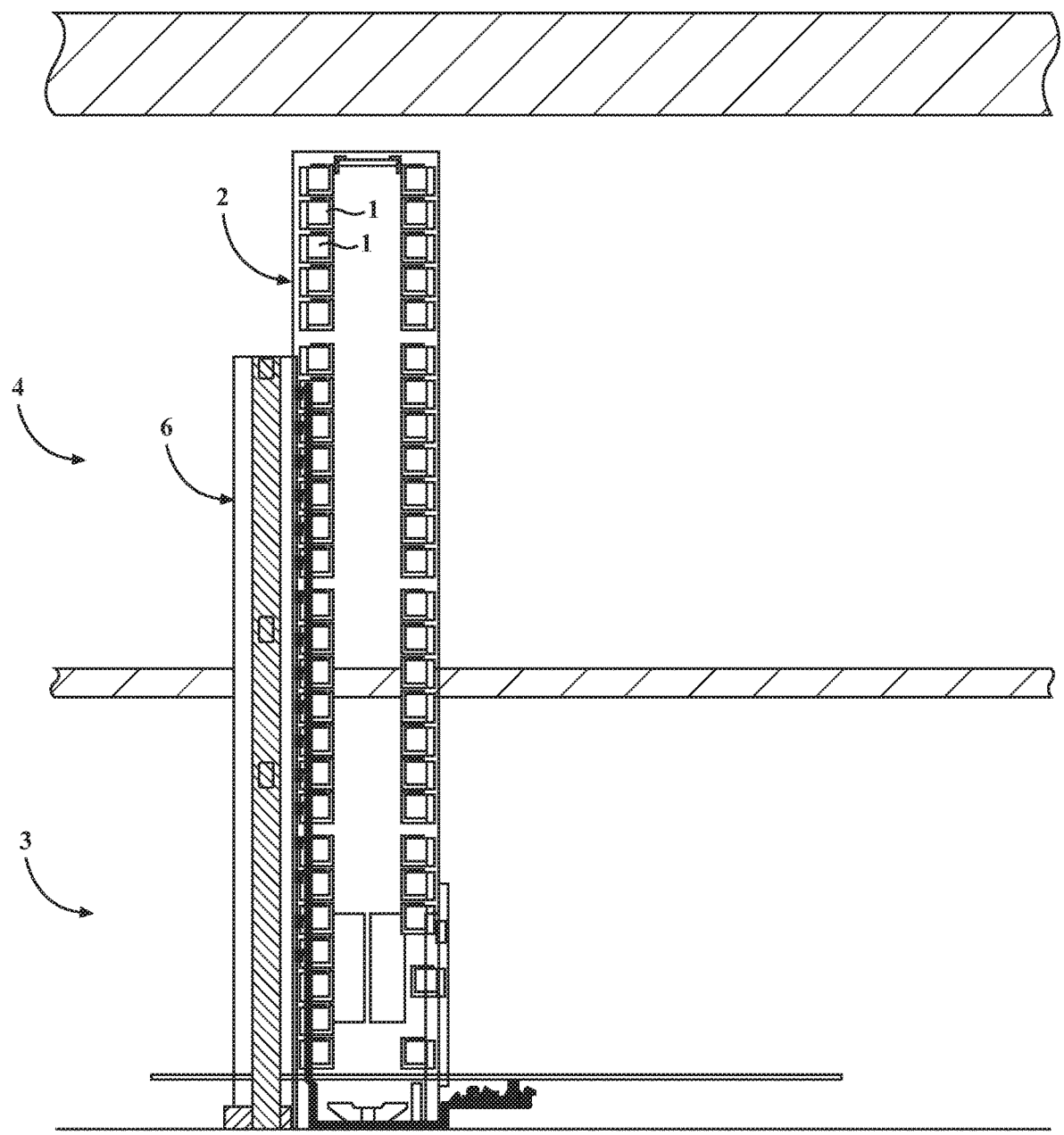
FIG. 4 is a design drawing showing a side cross-sectional view of a stocker on the intermediate, subfab/utility story of the fabrication facility of FIG. 1.

Referring to the Figures, wherein like numerals indicate corresponding parts throughout the several views, a load storage system 20, 120 for storing standardized containers is provided. As best shown in FIGS. 5-8B, the standardized containers 22 may be front opening unified pods (FOUPs) 22, as commonly used in semiconductor fabrication plants for holding and transporting semiconductor wafers. It should be appreciated that other containers could be utilized. As shown, the system 20, 120 may include an upper room 24, an intermediate room 26 and a lower room 28 vertically stacked on top of one another. Each of the rooms 24, 26, 28 may be at any physical level at, above, or below ground level, and any number of rooms may be provided. Additionally, the rooms may be used for various purposes including but not limited to, a sub fabrication room, a utility room and a clean room for semi-conductor assembly operations. A first porous plate 30, or floor, divides the upper and intermediate rooms 24, 26, and a second porous plate 32, or floor, divides the intermediate and lower rooms 26, 28. A bottom floor 34 is provided in the lower room 28, and a ceiling 36 is provided in the upper room 24. The porous plates 30, 32, floor 34 and ceiling 36 may allow the room to be kept clean by way of a downflow system wherein clean air is supplied through the ceiling 36 and flows downwardly through the first and second porous plates 30, 32 and ultimately flows out through the floor 34 to provide a controlled atmosphere. It should be appreciated that other types of floors/plates could be utilized.

Each of the rooms 24, 26, 28 includes a stocker (STK) 38, 40, 42. More particularly, the upper room 24 includes a first stocker 38, the intermediate room 26 includes a second stocker 40 and the lower room 28 includes a third stocker 42. Each stocker 38, 40, 42 is an area at which one or more standardized containers 22, such as front opening unified pods (FOUPs) 22, are contained. The stockers 38, 40, 42 may each include an enclosure for maintaining a controlled atmosphere and specialized interfaces for interacting with an automated material handling system (AMHS). Additionally/alternatively, the entire room in which the stocker 38, 40, 42 is located may be a controlled atmosphere, as explained above. Each stocker 38, 40, 42 includes a plurality of load supports 44, 144, each configured to hold at least one of the standardized containers 22. The load supports 44, 144 may include, for example, shelves 44, 144, compartments, racks, hooks, clamps, or other structures or mechanisms for holding one or more of the standardized containers 22. In the example embodiments, the load supports 44, 144 are shelves 44, 144. Each of the stockers 38, 40, 42 further includes a crane 46 that is adapted to move the containers between different load supports 44, 144 within the stocker 38, 40, 42. Each of the cranes 46 may include an arm assembly 48 (schematically shown) including corresponding pulleys, cables and/or other mechanism for moving the containers 22 within the stocker 38, 40, 42.

Figure 5:
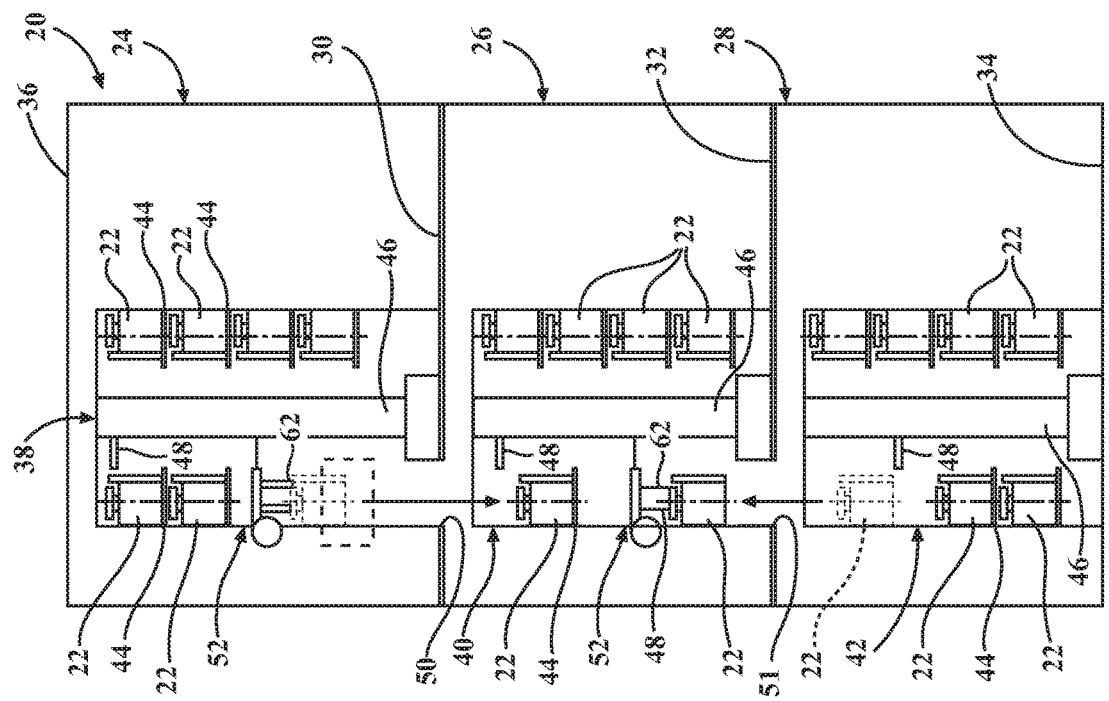
FIG. 5 is a schematic cross-sectional side view of a fabrication facility including a first embodiment of a vertical transfer device according to an aspect of the present disclosure.
Figure 7:
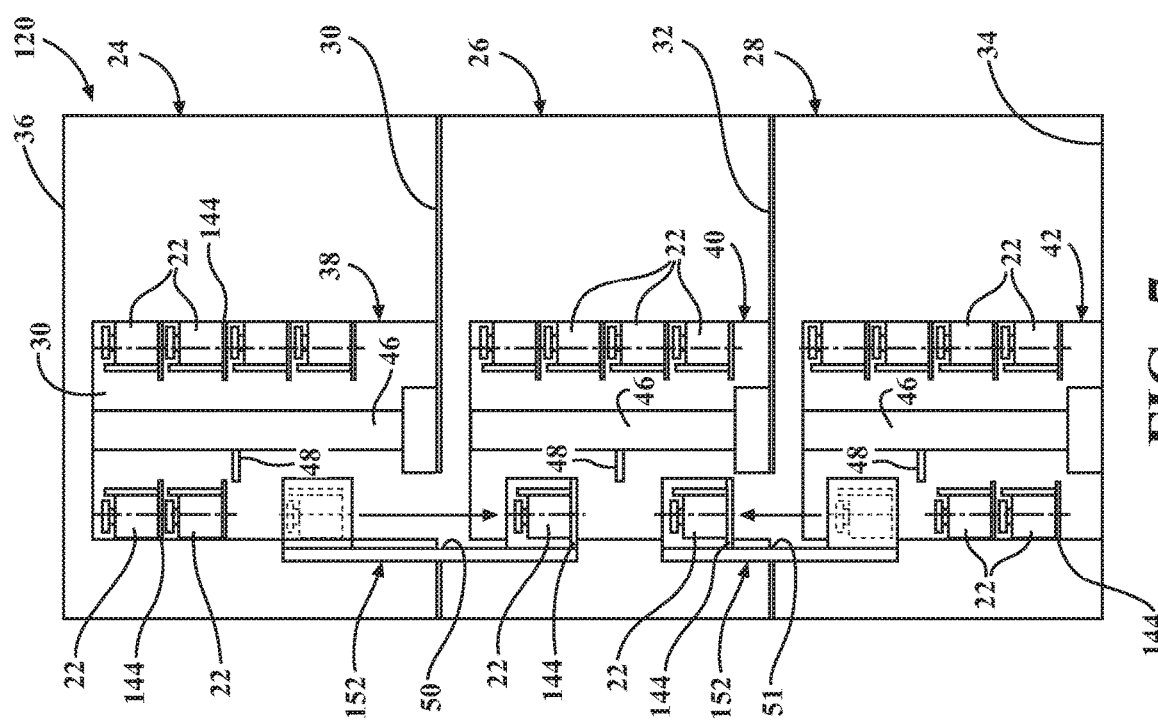
FIG. 7 is a schematic cross-sectional side view of a fabrication facility including a second embodiment of a vertical transfer device according to an aspect of the present disclosure.

A first portal 50 connects the first stocker 38 in the upper room 24 and the second stocker 40 in the intermediate room 26. A second portal 51 connects the second stocker 40 in the intermediate room 26 and the third stocker 42 in the lower room 28. The first portal 50 provides direct access between the first and second stockers 38, 40, and the second portal 51 provides direct access between the second and third stockers 40, 42. The first and second portals 50, 51 take the openings in the first and second porous plates 30, 32. The portals 50, 51 are sized such that the standardized containers 22 may pass therethrough. The upper, intermediate and lower rooms 24, 26, 28 of the building may be immediately adjacent one another, as shown in FIGS. 5 and 7. Alternately, the upper, intermediate and lower rooms 24, 26, 28 may be separated by one or more intermediate stories or other space such as a catwalk or plenum. In such a case, the portal 50, 51 may take the form of one or more tubes or other extended passage that extend vertically between the stockers 38, 40, 42 of the upper, intermediate and lower rooms 24, 26, 28, similar to an elevator shaft.

One or more vertical transfer device 52, 152 are provided for transferring the standardized containers through the portals 50 between the stockers 38, 40, 42. The vertical transfer devices 52, 152 are provided in vertical alignment with the shelves 44, 144 and portals 50 and are linearly moveable such that the standardized containers 22 may move linearly between the stockers 38, 40, 42 while remaining in vertical alignment with the shelves 44, 144.

According to an aspect, one or more of the load supports 44, 144 may be movable between a first configuration for holding a standardized container 22 and a second configuration for allowing a standardized container 22 to pass vertically therethrough by way of the vertical transfer device 52, 152. For example, according to the embodiment of the system shown in FIGS. 5-6B, the load support 44 may be a partitioned shelf plate 44 including two legs 54 generally parallel to one another and each extending in a forward direction from a backing wall 56 and each configured to move laterally outwardly, perpendicularly to the forward direction. The partitioned shelf plate 44 may move between the first configuration shown in FIG. 6A with the legs 54 proximate to one another for holding a standardized container 22 thereupon to the second configuration shown in FIG. 6B with the legs 54 spaced apart from one another for allowing a standardized container 22 to pass vertically therethrough. A linear motion (LM) block 58 may be attached to each of the legs 54 and movable along a linear motion rail 60 disposed along the backing wall 56 to allow each of the legs 40 to be moved laterally between the first and second configurations.

As shown in FIG. 5, the vertical transfer device 52 may include one or more hoists 52 disposed within the stocker 38, 40, 42. The hoists 52 may include a grasping mechanism 62 to selectively engage a corresponding lug 49 on one of the standardized containers 22 and to move the one of the standardized containers 22 vertically below the hoist 48 and between the vertical racks 26, 30. The hoist 48 may be similar to the type used in prior art cleanway overhead transport vehicles (CLW). As shown, the hoist 48 may be connected to the crane 46 for providing movement of the hoist 48, or it could be connected to a separate actuating mechanism.

Figure 8A:
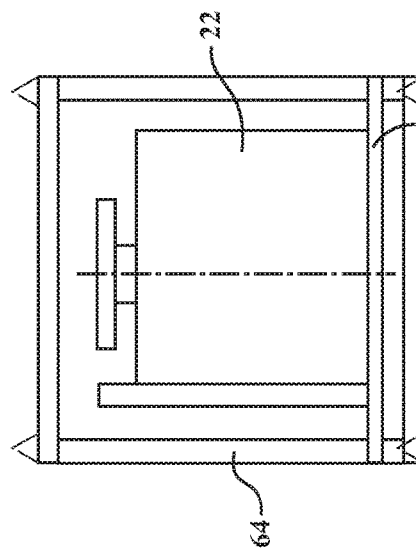
FIG. 8A is a side view of a load support including a cab frame surrounding a standardized container according to an aspect of the present disclosure.
Figure 8B:
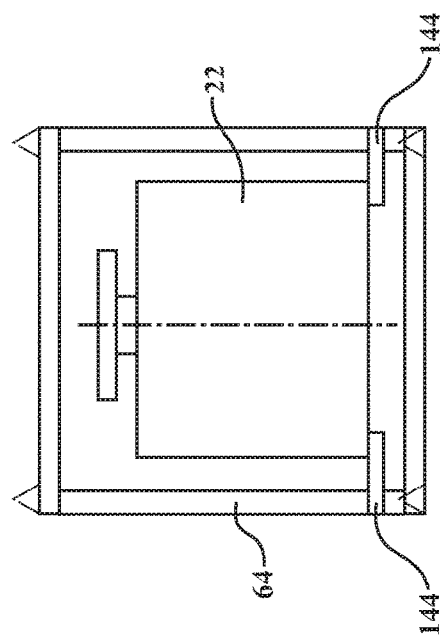
FIG. 8B is a front view of the load support including a cab frame surrounding a standardized container of FIG. 8A.

According to the embodiment of the system 120 shown in FIGS. 7-8B, at least one of the load supports 144 may include a cab frame 64 for surrounding a standardized container 22, and the load support 144 may be movable between the stockers 38, 40, 42 for conveying a standardized container 22 therein. In this way, the load support 144 may function similarly to an elevator car for conveying a standardized container 22 vertically between the stockers 38, 40, 42.

According to an aspect shown in FIG. 8, the vertical transfer device 152 may include a shelf plate 152, or rail, to move one or more of the load supports 144 with a corresponding standardized container 22 disposed thereupon between the stockers 38, 40 42. The shelf plate 152 may, for example, provide movement of two or more of the load supports 144 together. According to an aspect, one or more of the load supports 144 may be moveably connected to the shelf plate 152 to move vertically relative to the shelf plate 152. In this way, selected ones of the movable shelf plates 152 may be moved between the stockers 38, 40, 42 while others may be left stationary. Alternatively, the shelf plate 152 could be configured to be moveable relative to the rest of the stocker 38, 40, 42 and the load supports 144 could be fixed to the shelf plate 152 to move therewith.

With reference to FIG. 9, a method 100 is provided for moving a standardized container 22 within a load storage system 20, 120 directly between a first stocker 38 on a first story 24 of a building including a first load support 44, 144 and a second stocker 40 on a second story 26 of the building directly above the first stocker 38 and including a second load support 44, 144, wherein a floor and/or plate 30 is positioned between the first and second stockers 38, 40, and wherein a portal 50 is defined by the floor 30 between the first and second stockers 38, 40 in alignment with the first load support 44, 144 in the first stocker 38 and the second load support 44, 144 in the second stocker 38, 40. The method 100 includes 102 disposing a standardized container upon the load support 44, 144 within the first stocker 38. The method also includes 104 engaging the standardized container with a vertical transfer deice 52, 152. The method also includes 106 moving the standardized container 22 with the vertical transfer device 52, 152 through the portal 50 from the first stocker 38 to the second stocker 40. The method also includes 108 positioning the standardized container 22 on the second load support 44, 144 within the second stocker 40.

According to the embodiment shown in FIG. 5, and shown in the flowchart of FIG. 10, the step of 104 engaging the standardized container with a vertical transfer device 20 may include the sub-step 110 of directly engaging a lug 49 on the standardized container 22 with a corresponding grasping mechanism 62 attached to a hoist 52.

According to the embodiment of the system 120 shown in FIG. 7 and shown in the flowchart at FIG. 11, the step of 104 engaging the standardized container with a vertical transfer device 20 may include the sub-step of 112 of moving the load support 144 along the rail 60 from the first stocker 38, through the portal 50, to the second stocker 40.

Figure 6A:
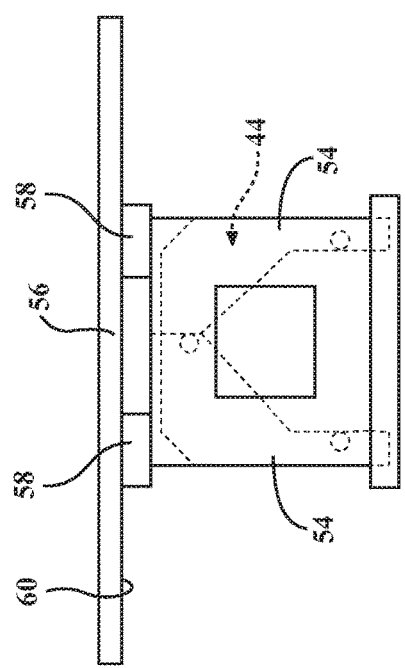
FIG. 6A is a top view of a partitioned shelf plate in a first configuration according to an aspect of the present disclosure.
Figure 6B:
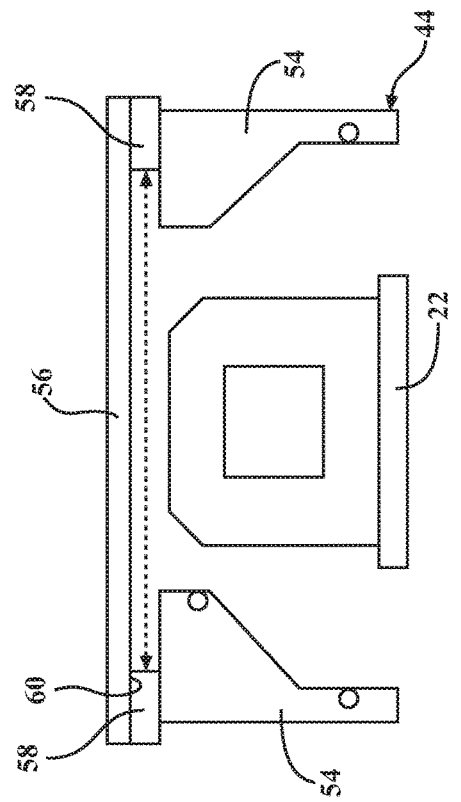
FIG. 6B is a top view of the partitioned shelf plate of FIG. 6A in a second configuration according to an aspect of the present disclosure.

According to the flowchart at FIG. 12, the step of 104 engaging the standardized container with a vertical transfer device 20 may also include the sub step 114 of moving one or more of the load supports 44 between a first configuration for holding a standardized container 22 and a second configuration for allowing a standardized container 22 to pass vertically therethrough. Specifically, as shown in FIGS. 6A and 6B, the method may include moving two legs 54 of the load support 44 laterally outwardly.

Obviously, many modifications and variations of the present invention are possible in light of the above teachings and may be practiced otherwise than as specifically described while within the scope of the appended claims. These antecedent recitations should be interpreted to cover any combination in which the inventive novelty exercises its utility. The use of the word "said" in the apparatus claims refers to an antecedent that is a positive recitation meant to be included in the coverage of the claims whereas the word "the" precedes a word not meant to be included in the coverage of the claims.

What is claimed is:

1. A load storage system for holding standardized containers, comprising:
  a first stocker for being positioned on a first story of a building and a second stocker for being positioned on a second story of a building, said first and second stockers each including at least one load support for supporting the standardized containers;
  a floor positioned between said first and second stockers;
  said floor defining a portal between and directly connecting said first and second stockers for allowing the standardized containers to be moved between said first and second stockers, said portal defined in alignment with at least one of said load supports in said first stocker and at least one of said load supports in said second stocker; and
  a vertical transfer device positioned in alignment with at least one of said load supports in said first stocker and at least one of said load supports in said second stocker and configured to move the standardized containers through said portal between said first and second stockers;
  wherein said at least one load support of said first stocker and said at least one load support of said second stocker each include a shelf plate including two legs being moveable relative to one another between a first configuration in which said legs are positioned proximate to one another to hold the standardized containers and a second configuration in which said legs are spaced from one another to allow said vertical transfer device and the standardized containers to pass between said legs.

2. The load storage system as set forth in claim 1 wherein said vertical transfer device includes a hoist including a grasping mechanism to selectively engage a corresponding lug on the standardized container and to move the standardized container vertically below said hoist.

3. The load storage system as set forth in claim 2 wherein each of said stockers further includes a crane, and wherein said hoist is coupled with said crane to provide movement of said hoist.

4. The load storage system as set forth in claim 1 wherein said vertical transfer device further includes a backing wall, wherein said legs extend in parallel relationship with one another in a forward direction being perpendicular to said backing wall, and wherein said legs are slideably coupled to said backing wall and moveable along said backing wall between said first and second configurations.

5. A load storage system for holding standardized containers, comprising:
a first stocker for being positioned on a first story of a building and a second stocker for being positioned on a second story of a building, said first and second stockers each including at least one load support for supporting the standardized containers;
a floor positioned between said first and second stockers;
said floor defining a portal between and directly connecting said first and second stockers for allowing the standardized containers to be moved between said first and second stockers, said portal defined in alignment with at least one of said load supports in said first stocker and at least one of said load supports in said second stocker; and
a vertical transfer device positioned in alignment with at least one of said load supports in said first stocker and at least one of said load supports in said second stocker and configured to move the standardized containers through said portal between said first and second stockers;
wherein said vertical transfer device includes at least one rail extending through said portal between said first and second stockers, and wherein at least one of said load supports is coupled with and moveable along said rail between said first and second stockers.

6. The load storage system as set forth in claim 5 wherein said load support includes a housing for surrounding the standardized containers, and wherein said housing is coupled with said at least one rail.

7. The load storage system as set forth in claim 1 wherein the at least one load support is a shelf.

8. The load storage system as set forth in claim 1 wherein said at least one load support in each of said stockers includes a plurality of load supports positioned in vertical alignment with one another.

9. The load storage system as set forth in claim 8 each of said stockers further includes a crane for moving the standardized containers between said plurality of load supports.

10. A method for moving a standardized container within a load storage system directly between a first stocker on a first story of a building including a first load support and a second stocker on a second story of a building directly above the first stocker and including a second load support, wherein a floor is positioned between the first and second stockers, and wherein a portal is defined by the floor between the first and second stockers in alignment with the first load support in the first stocker and the second load support in the second stocker, said method comprising the steps of:
disposing a standardized container upon the first load support within the first stocker;
engaging the standardized container with a vertical transfer device;
moving the standardized container with the vertical transfer device through the portal from the first stocker to the second stocker and positioning the standardized container on the second load support within the second stocker; and
disengaging the standardized container from the vertical transfer device;
wherein at least one of the first and second load supports includes a shelf plate including a pair of legs being moveable relative to one another, and wherein the method further includes moving the legs relative to one another into a first configuration in which the legs are positioned proximate to one another for holding the standardized container, moving the legs into a second configuration in which the legs are spaced from one another, and passing the vertical transfer device and one of the standardized containers between the legs.

11. The method as set forth in claim 10 wherein the vertical transfer device includes a hoist including a grasping mechanism, and wherein said method further includes engaging a lug on the standardized container to position the standardized container vertically below the hoist.

12. The method as set forth in claim 11 wherein each of the stockers includes a crane, and wherein the hoist is coupled with the crane to provide movement of the crane.

13. The method as set forth in claim 10 wherein the vertical transfer device includes at least one rail extending through the portal between the first and second stockers, and wherein at least one of the load supports is moveable along the rail between the first and second stockers through the portal, and wherein said method further includes moving the at least one of the load supports along the rail from the first stocker, through the portal and to the second stocker.

14. The method as set forth in claim 13 wherein the at least one of the load support includes a housing for surrounding the standardized containers, and wherein the housing is coupled with the at least one rail.

15. The method as set forth in claim 10 wherein the first load support of the first stocker includes a plurality of first load supports positioned in vertical alignment with one another and wherein the second load support of the second stocker includes a plurality of second load supports positioned in vertical alignment with one another.

16. The method as set forth in claim 10 wherein the vertical transfer device includes a backing wall, wherein the legs extend in parallel relationship with one another in a forward direction being perpendicular to the backing wall, and wherein the legs are slideably coupled to the backing wall and moveable along the backing wall between the first and second configurations.

17. The method as set forth in claim 10 wherein the vertical transfer device is arranged in alignment with the load support of the first stocker and the load support of the second stocker.

18. The method as set forth in claim 10 wherein the first and second load supports are each a shelf.

* * * * *